(12) United States Patent
Chen et al.

(10) Patent No.: US 11,412,851 B2
(45) Date of Patent: Aug. 16, 2022

(54) SLIDE RAIL ASSEMBLY

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 335 days.

(21) Appl. No.: 16/843,910

(22) Filed: Apr. 9, 2020

(65) Prior Publication Data

US 2021/0169223 A1 Jun. 10, 2021

(30) Foreign Application Priority Data

Dec. 6, 2019 (TW) .................................. 108145013

(51) Int. Cl.
*A47B 96/07* (2006.01)
*F16C 29/00* (2006.01)
*F16C 29/02* (2006.01)

(52) U.S. Cl.
CPC ............ *A47B 96/07* (2013.01); *F16C 29/004* (2013.01); *F16C 29/005* (2013.01); *F16C 29/02* (2013.01)

(58) Field of Classification Search
CPC ....... A47B 96/07; A47B 88/483; A47B 88/43; A47B 88/407; A47B 88/487; A47B 88/49; A47B 88/493; A47B 57/545; A47B 57/485; A47B 2088/4235; F16C 29/004; F16C 29/005; F16C 29/02; F16C 29/04; F16C 29/045; F16C 29/046; F16C 2314/72; H05K 7/183; H05K 7/186; H05K 7/00;

(Continued)

(56) References Cited

U.S. PATENT DOCUMENTS

| 10,194,556 B2 | 1/2019 | Chen |
| 10,306,983 B2 | 6/2019 | Chen |
| 10,349,741 B2 | 7/2019 | Chen |

(Continued)

FOREIGN PATENT DOCUMENTS

| CN | 112841949 | * | 2/2021 |
| EP | 3 322 269 A1 | | 5/2018 |

(Continued)

*Primary Examiner* — Janet M Wilkens
(74) *Attorney, Agent, or Firm* — Winston Hsu (57) ABSTRACT

A slide rail assembly includes a bracket device, a driving device and a rail member. The bracket device includes a supporting frame, a bracket and a fastening member. The bracket is arranged on the supporting frame. The driving device and the bracket device are movable relative to each other. The rail member and the bracket device are movable relative to each other. When the rail member is moved relative to the bracket device from a first predetermined position along a direction, the rail member is able to drive the driving device to move from a first position to a second position, in order to drive the fastening member to switch from a first state to a second state.

17 Claims, 12 Drawing Sheets

(58) Field of Classification Search
CPC ...... H05K 7/1489; H05K 7/1421; H05K 7/14; H05K 7/1488; H05K 5/00
USPC ........... 248/298.1, 220.43, 219.3; 312/223.1, 312/223.2, 265.1–265.4, 334.4, 334.5; 174/50; 211/26; 361/727, 724, 683
See application file for complete search history.

(56) References Cited

U.S. PATENT DOCUMENTS

| | | | |
|---|---|---|---|
| 10,357,105 | B2 | 7/2019 | Chen |
| 11,009,069 | B1* | 5/2021 | Chen ...................... A47B 88/49 |
| 2018/0125234 | A1* | 5/2018 | Chen ...................... A47B 88/43 |
| 2018/0168349 | A1 | 6/2018 | Chen |
| 2018/0220797 | A1* | 8/2018 | Chen ................... H05K 7/1489 |
| 2018/0360212 | A1* | 12/2018 | Chen ................... H05K 7/1489 |
| 2019/0274427 | A1* | 9/2019 | Chen ................... A47B 88/407 |
| 2019/0373757 | A1* | 12/2019 | Chen ................... H05K 7/1489 |
| 2021/0148403 | A1* | 5/2021 | Chen ................... H05K 7/1489 |

FOREIGN PATENT DOCUMENTS

| | | | |
|---|---|---|---|
| EP | 3634094 | * | 4/2020 |
| EP | 3833169 | * | 6/2021 |
| JP | 2018-114263 A | | 7/2018 |
| TW | 202014129 | * | 4/2020 |

\* cited by examiner

SLIDE RAIL ASSEMBLY

BACKGROUND OF THE INVENTION

1. Field of the Invention

The present invention relates to a slide rail mechanism, and more particularly, to a slide rail assembly having a bracket device.

2. Description of the Prior Art

US patent with U.S. Pat. No. 10,194,556 B2 discloses a bracket device of a slide rail mechanism. The bracket device includes a first supporting frame, a second supporting frame and a first bracket to consist a three-section bracket mechanism. Wherein, the first bracket and the second supporting frame are movable relative to each other, and the first supporting frame is movably mounted in a supporting passage of a supporting rail on a back side of a rail member.

However, for different requirements of market, users do not want to choose the three-section bracket device. How to develop a related different product to create more options in the market has become an issue.

SUMMARY OF THE INVENTION

The present invention relates to a slide rail assembly having a bracket device.

According to an aspect of the present invention, a slide rail assembly includes a first bracket device, a driving device and a rail member. The first bracket device includes a supporting frame, a bracket and a fastening member. The bracket is arranged on the supporting frame. The driving device and the first bracket device are longitudinally movable relative to each other. The rail member and the first bracket device are longitudinally movable relative to each other. Wherein, when the rail member is moved relative to the first bracket device from a first predetermined position along a first direction by a predetermined traveling distance, the rail member is able to drive the driving device to move from a first position to a second position, in order to drive the fastening member of the first bracket device to switch from a first state into a second state.

Preferably, the supporting frame is connected to the bracket.

Preferably, the fastening member is pivoted to the bracket by a shaft member.

Preferably, the bracket includes a longitudinal portion and at least one mounting member arranged adjacent to the longitudinal portion.

Preferably, the bracket further includes an end portion substantially perpendicularly connected to the longitudinal portion, the at least one mounting member is arranged on the end portion.

Preferably, when the fastening member of the first bracket device is in the first state, a fastening portion of the fastening member is far from the at least one mounting member. When the fastening member of the first bracket device is in the second state, the fastening portion of the fastening member is adjacent to the at least one mounting member.

Preferably, the driving device includes a first driving feature. The rail member includes a first structure. The rail member is able to abut the first driving feature through the first structure to drive the driving device move along the first direction from the first position to the second position.

Preferably, the driving device further includes a second driving feature, the rail member further includes a second structure, the rail member is able to abut the second driving feature through the second structure to drive the driving device move along a second direction opposite to the first direction from the second position to the first position, in order to drive the fastening member of the first bracket device to switch from the second state into the first state.

Preferably, the driving device further includes an extension member and an elastic member, the extension member is connected to the elastic member, the elastic member includes a first elastic arm, and the first driving feature is arranged on the first elastic arm.

Preferably, the elastic member further includes a second elastic arm, and the second driving feature is arranged on the second elastic arm.

Preferably, the fastening member includes a first extension section and a second extension section, the driving device further includes a first driving portion and a second driving portion both arranged on the extension member, and the first driving portion and the second driving portion are respectively corresponding to the first extension section and the second extension section.

Preferably, a longitudinal feature is arranged on one of the driving device and the first bracket device, and a connecting member is arranged on the other one of the driving device and the first bracket device. The connecting member is able to penetrate through a part of the longitudinal feature, such that the driving device and the first bracket device are longitudinally movable relative to each other in a range.

Preferably, the slide rail assembly further includes a reinforcing member and a second bracket device. Wherein, the reinforcing member is arranged on the rail member, the reinforcing member includes a reinforcing passage, and the second bracket device is movably mounted in the reinforcing passage through a longitudinal section.

Preferably, the supporting frame includes an upper supporting wall, a lower supporting wall and a longitudinal wall connected between the upper supporting wall, and the lower supporting wall, a supporting passage is defined by the upper supporting wall, a lower supporting wall and the longitudinal wall and configured to accommodate the rail member, the upper supporting wall and the lower supporting wall of the supporting frame is respectively configured to clad a portion of an upper side wall and a portion of a lower side wall of the rail member.

According to another aspect of the present invention, a bracket driving mechanism includes a bracket device and a driving device. The bracket device includes a supporting frame, a bracket and a fastening member. The bracket is arranged on the supporting frame. The fastening member is movably mounted on the bracket. The driving device and the bracket device are movable relative to each other. Wherein, when one of the driving device and the bracket device is moved from a first position to a second position relative to the other one of the driving device and the bracket device, the driving device is able to drive the fastening member of the bracket device to switch from a first state into a second state.

Preferably, the supporting frame is connected to the bracket.

Preferably, the bracket includes a longitudinal portion and at least one mounting member adjacent to the longitudinal portion, the fastening member is pivoted to the bracket by a shaft member.

Preferably, when the fastening member of the bracket device is in the first state, a fastening portion of the fastening member is far from the at least one mounting member, when the fastening member of the bracket device is in the second state, the fastening portion of the fastening member is adjacent to the at least one mounting member.

Preferably, the fastening member includes a first extension section and a second extension section, the driving device includes a first driving portion and a second driving portion, and the first driving portion and the second driving portion are respectively corresponding to the first extension section and the second extension section.

Preferably, a longitudinal feature is arranged on one of the driving device and the bracket device, and a connecting member is arranged on the other one of the driving device and the bracket device, the connecting member is able to penetrate through a part of the longitudinal feature, such that the driving device and the bracket device are longitudinally movable relative to each other.

These and other objectives of the present invention will no doubt become obvious to those of ordinary skill in the art after reading the following detailed description of the preferred embodiment that is illustrated in the various figures and drawings.

DETAILED DESCRIPTION

In the description below, it will be understood that "a longitudinal direction A1" is a direction in which two slide rails of a slide rail assembly are movable relative to each other when the two slide rails are mounted together. It is noticed that solid arrows denoted "A1" in the figures of the present invention refers to a direction in which the two slide rails of the slide rail assembly are extended relative to each other and dotted arrows denoted "A1'" in the figures of the present invention refers to a direction in which the two slide rails of the slide rail assembly are retracted relative to each other. It will also be understood that "a transverse direction A2" (or a lateral direction T) is a direction that is perpendicular to the longitudinal direction A1 of the slide rail assemblies and left/right sides of the object on which two slide rail assemblies are respectively mounted. It will yet be understood that "a height direction A3" is a direction perpendicular to the longitudinal direction and the transverse direction. When a component is referred to as being "on" or "connected to" another component, it may be directly on or connected to the other component, or intervening components may be presented. In contrast, when a component is referred to as being "directly on" or "directly connected to" another component, there are no intervening components or layers presented.

Figure 1:
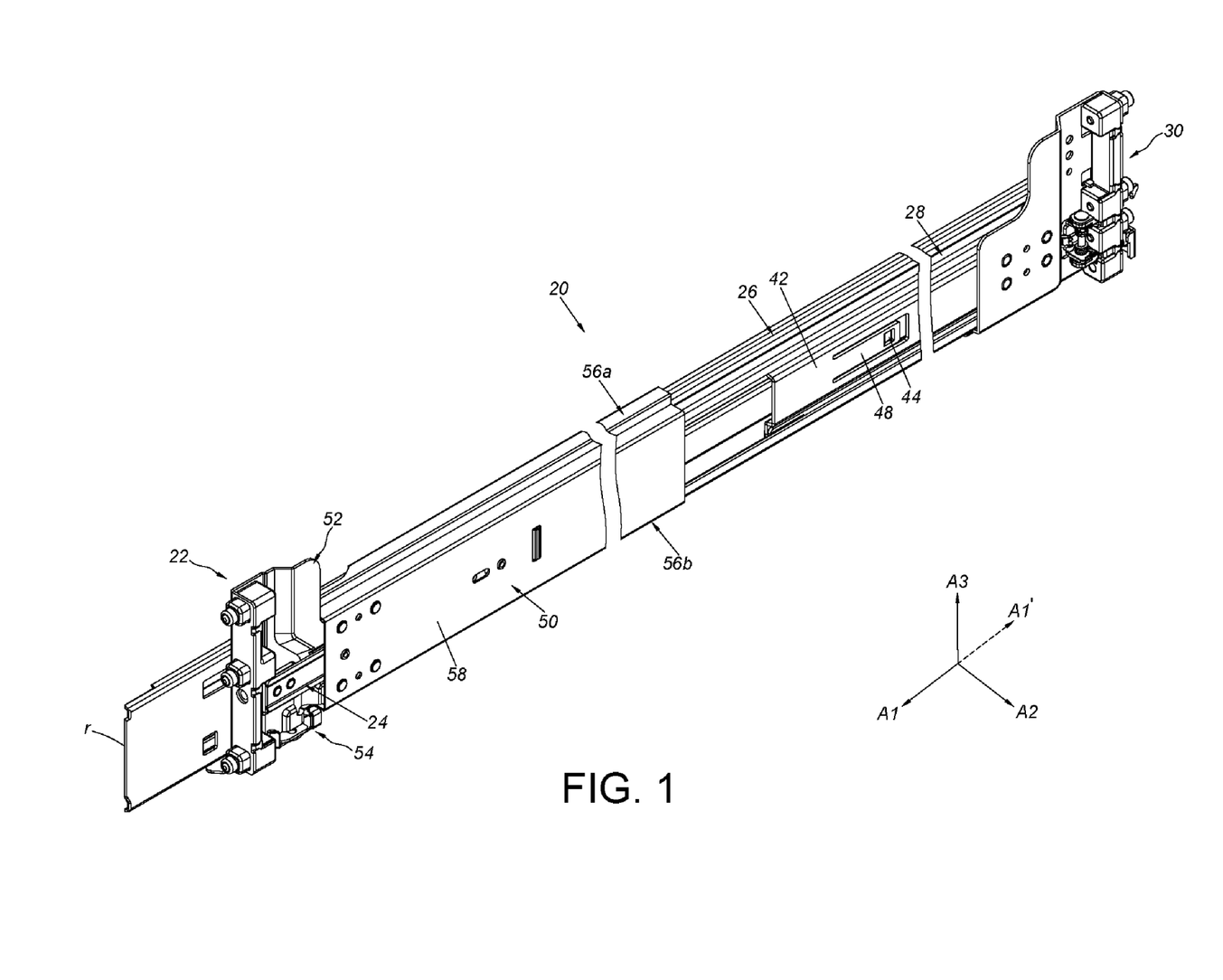
FIG. 1 is a diagram illustrating a slide rail assembly according to an embodiment of the present invention.
Figure 2:
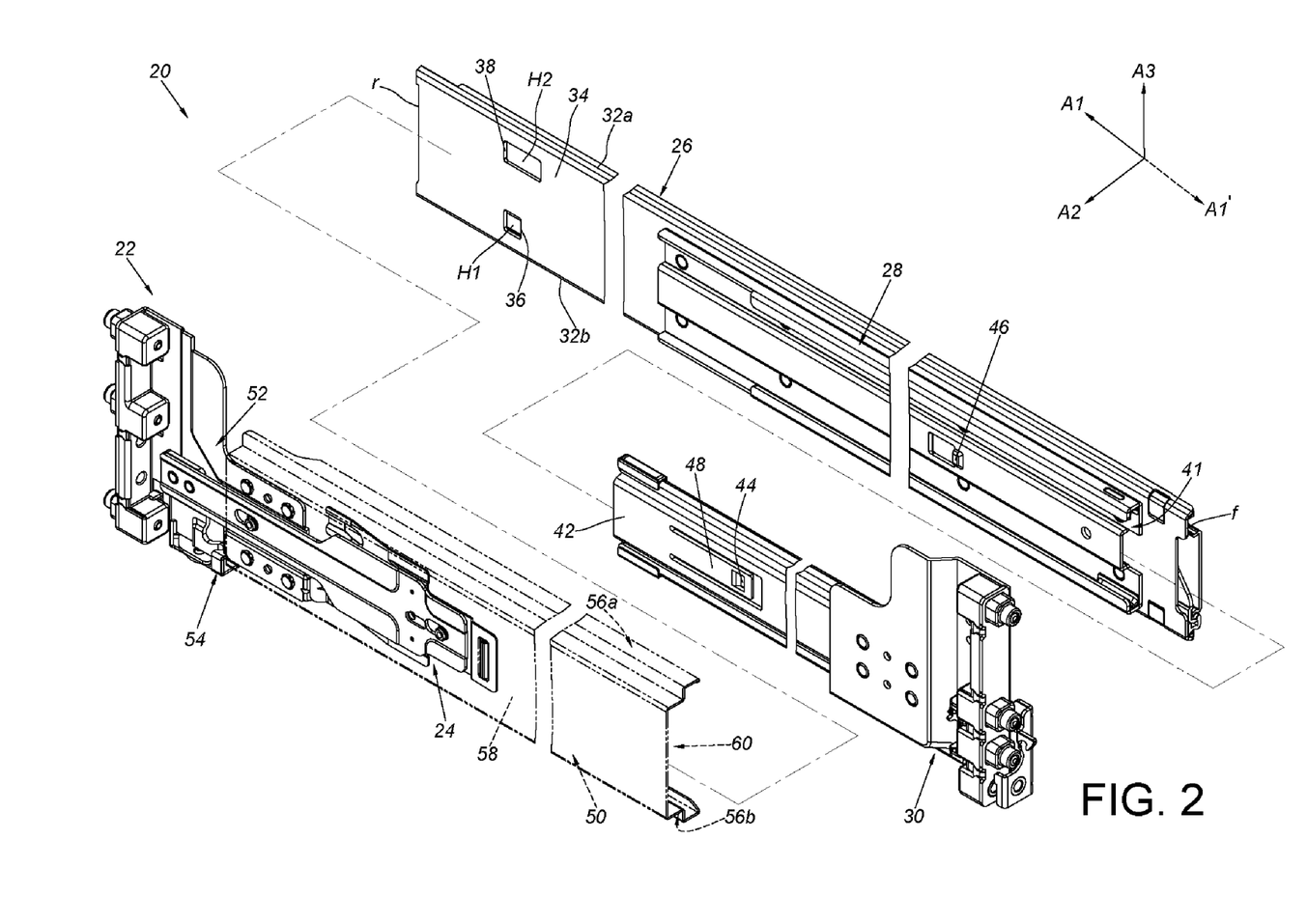
FIG. 2 is an exploded view illustrating the slide rail assembly according to the embodiment of the present invention.

As shown in FIG. 1 and FIG. 2, a slide rail assembly 20 of an embodiment of the present invention includes a first bracket device 22, a driving device 24 and a rail member 26. Preferably, the slide rail assembly 20 further includes a reinforcing member 28 and a second bracket device 30.

The rail member 26 includes an upper side wall 32a, a lower side wall 32b and a longitudinal body 34 connected between the upper side wall 32a and the lower side wall 32b. Wherein, the rail member 26 includes a first structure 36. Preferably, the rail member 26 further includes a second structure 38. For example, the first structure 36 and the second structure 38 are walls. Preferably, a first space H1 (such as a hole or a slot) and a second space H2 are arranged on the longitudinal body 34 of the rail member 26, and the first structure 36 is an inner wall of the first space H1, and the second structure 38 is an inner wall of the second space H2, but the present invention is not limited specifically.

The reinforcing member 28 is arranged on the rail member 26. For example, the reinforcing member 28 is connected (such as fixedly connected) to the longitudinal body 34 of the rail member 26, in order to improve the structure strength of the rail member 26. The reinforcing member 28 includes a reinforcing passage 41 defined by a plurality of walls, and the second bracket device 30 is movably mounted on the reinforcing passage 41 through a longitudinal section 42. Preferably, the second bracket device 30 and the reinforcing member 28 have a first limiting feature 44 and a second limiting feature 46 respectively. When the second bracket device 30 is moved to a position relative to the reinforcing member 28, the first limiting feature 44 and the second limiting feature 46 are blocked by each other. In the present embodiment, the first limiting feature 44 and the second limiting feature 46 are two protrusions. The longitudinal section 42 of the second bracket device 30 includes an elastic arm 48, and the elastic arm 48 has the first limiting feature 44, but the present invention is not limited specifically. Wherein, the second bracket device 30 is able to be moved to a position adjacent to an end portion (such as a front end portion f) of the rail member 26.

The first bracket device 22 is able to be moved to a position adjacent to another end portion (such as a rear end portion r) of the rail member 26. The first bracket device 22 includes a supporting frame 50, a bracket 52 and a fastening member 54. The bracket 52 is arranged on the supporting frame 50. Preferably, the supporting frame 50 includes an upper supporting wall 56a, a lower supporting wall 56b and a longitudinal wall 58 connected between the upper supporting wall 56a and the lower supporting wall 56b. A supporting passage 60 is defined by the upper supporting wall 56a, the lower supporting wall 56b and the longitudinal wall 58. The supporting passage 60 is configured to accommodate and be penetrated by the rail member 26. The upper supporting wall 56a and the lower supporting wall 56b of the supporting frame 50 is respectively configured to clad a portion of the upper side wall 32a and a portion of the lower side wall 32b of the rail member 26. According to above arrangement, the structure strength of the rail member 26 is able to be improved through the supporting frame 50 of the first bracket device 22, and the traveling distance of the first bracket device 22 along the rail member 26 is also improved. On the other hand, a bracket driving mechanism can consist of the driving device 24 and the first bracket device 22, and the driving device 24 and the first bracket device 22 are able to be longitudinally moved relative to each other.

Figure 3:
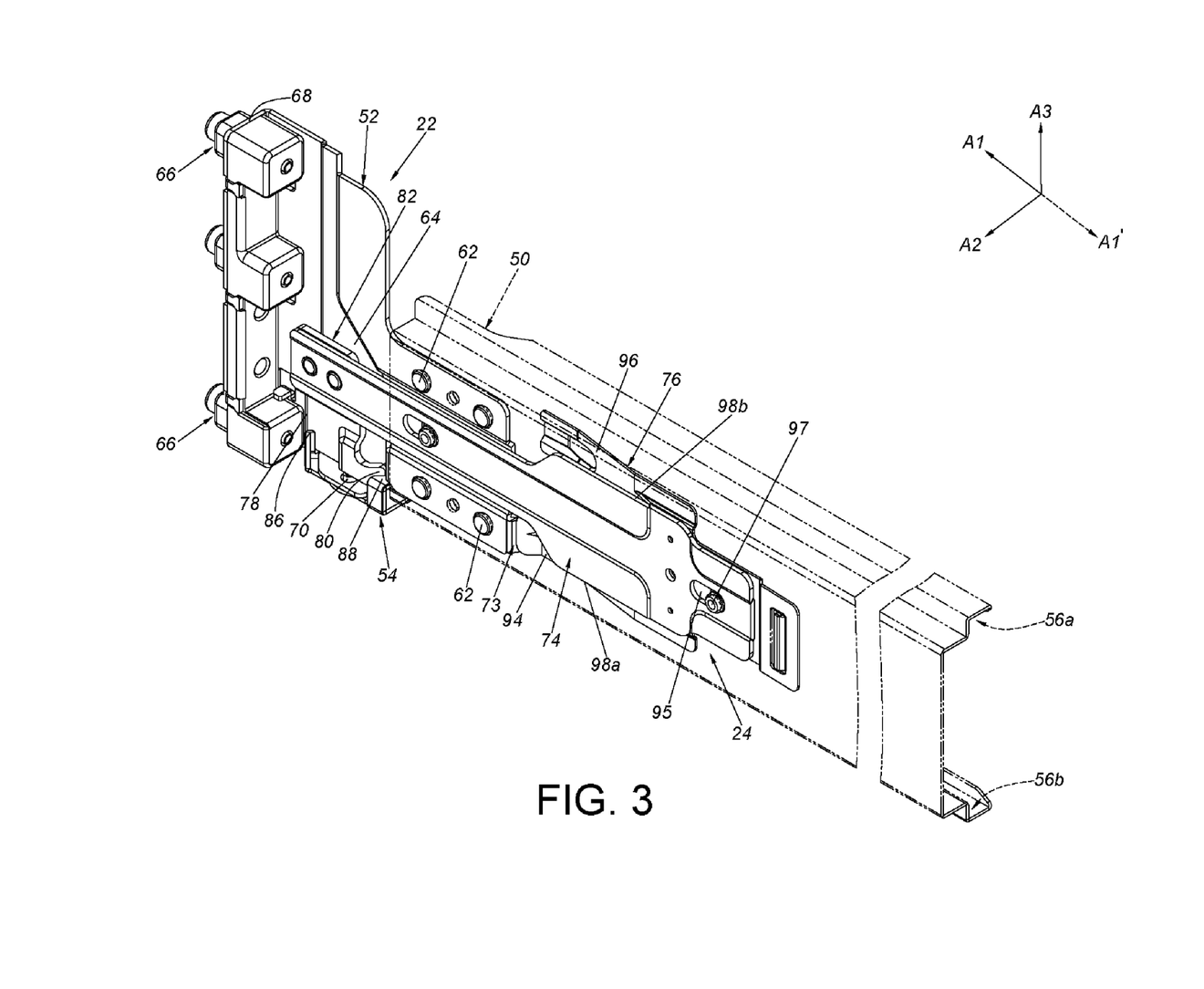
FIG. 3 is a diagram illustrating a bracket driving mechanism of the slide rail assembly according to the embodiment of the present invention.
Figure 4:
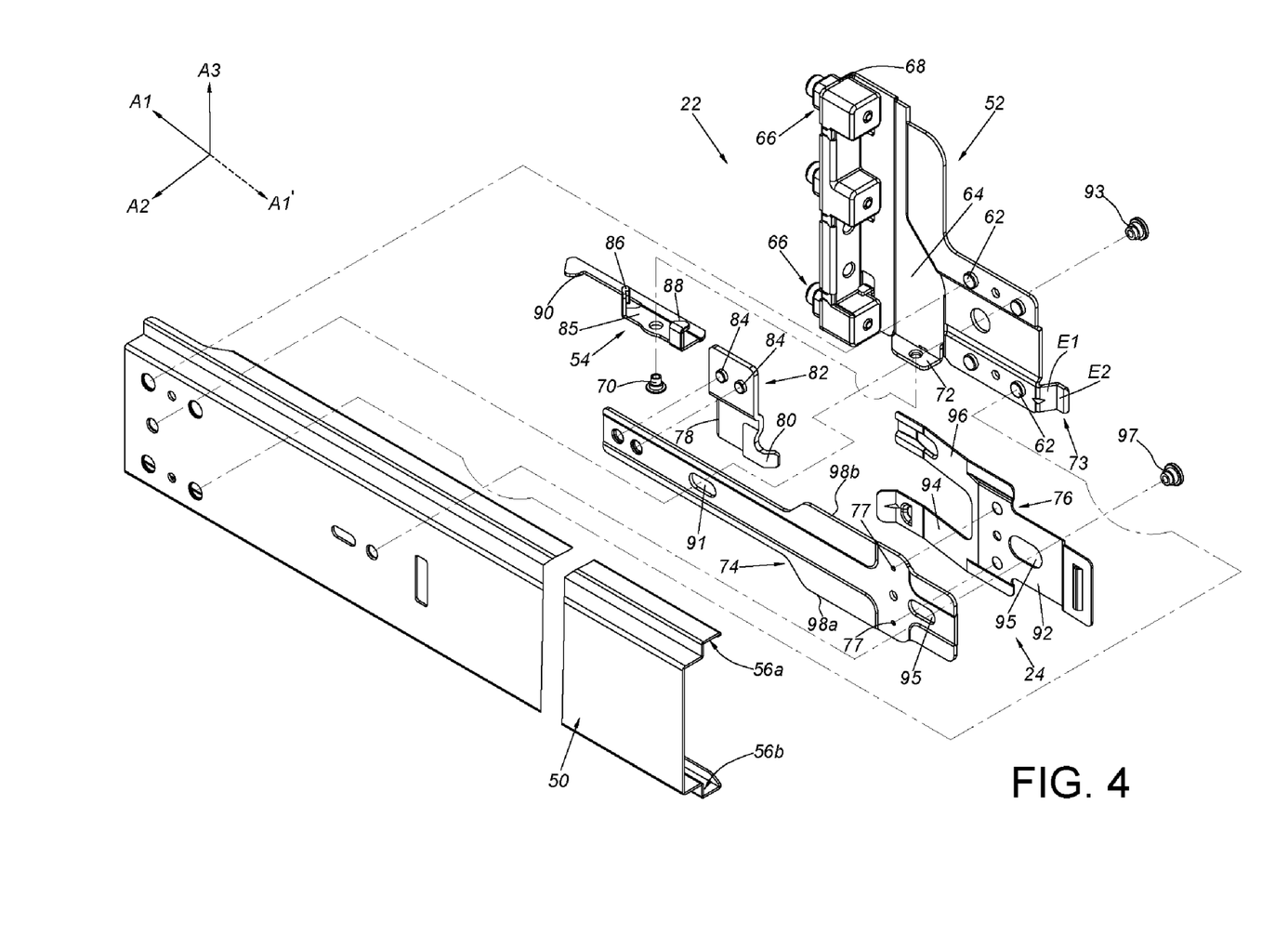
FIG. 4 is an exploded view illustrating the bracket driving mechanism of the slide rail assembly according to the embodiment of the present invention.

As shown in FIG. 3 and FIG. 4, the supporting frame 50 and the bracket 52 of the first bracket device 22 are connected to each other. In the present embodiment, the supporting frame 50 is fixedly connected to the bracket 52 through at least one connecting portion 62, and the supporting frame 50 and the bracket 52 can be regarded as one piece. Wherein, the bracket 52 includes a longitudinal portion 64 and at least one mounting member 66 adjacent to the longitudinal portion 64.

Preferably, the bracket 52 further includes an end portion 68 substantially perpendicularly connected to the longitudinal portion 64. The at least one mounting member 66 is arranged on the end portion 68.

Preferably, the fastening member 54 is movably mounted on the bracket 52. For example, the fastening member 54 is pivoted to the bracket 52 by a shaft member 70. In the present embodiment, the fastening member 54 is pivoted to a mounting portion 72 of the longitudinal portion 64 of the bracket 52 by the shaft member 70, and the mounting portion 72 is substantially laterally connected to the longitudinal portion 64.

Preferably, the bracket 52 further includes an auxiliary structure 73. The auxiliary structure 73 includes a first auxiliary section E1 and a second auxiliary section E2. Wherein, the first auxiliary section E1 (which is connected to the longitudinal portion 64 of the bracket 52) is deflected by an angle from the longitudinal portion 64 of the bracket 52. The second auxiliary section E2 is connected to the first auxiliary section E1, such that the second auxiliary section E2 has a laterally height relative to the longitudinal portion 64.

Figure 5:
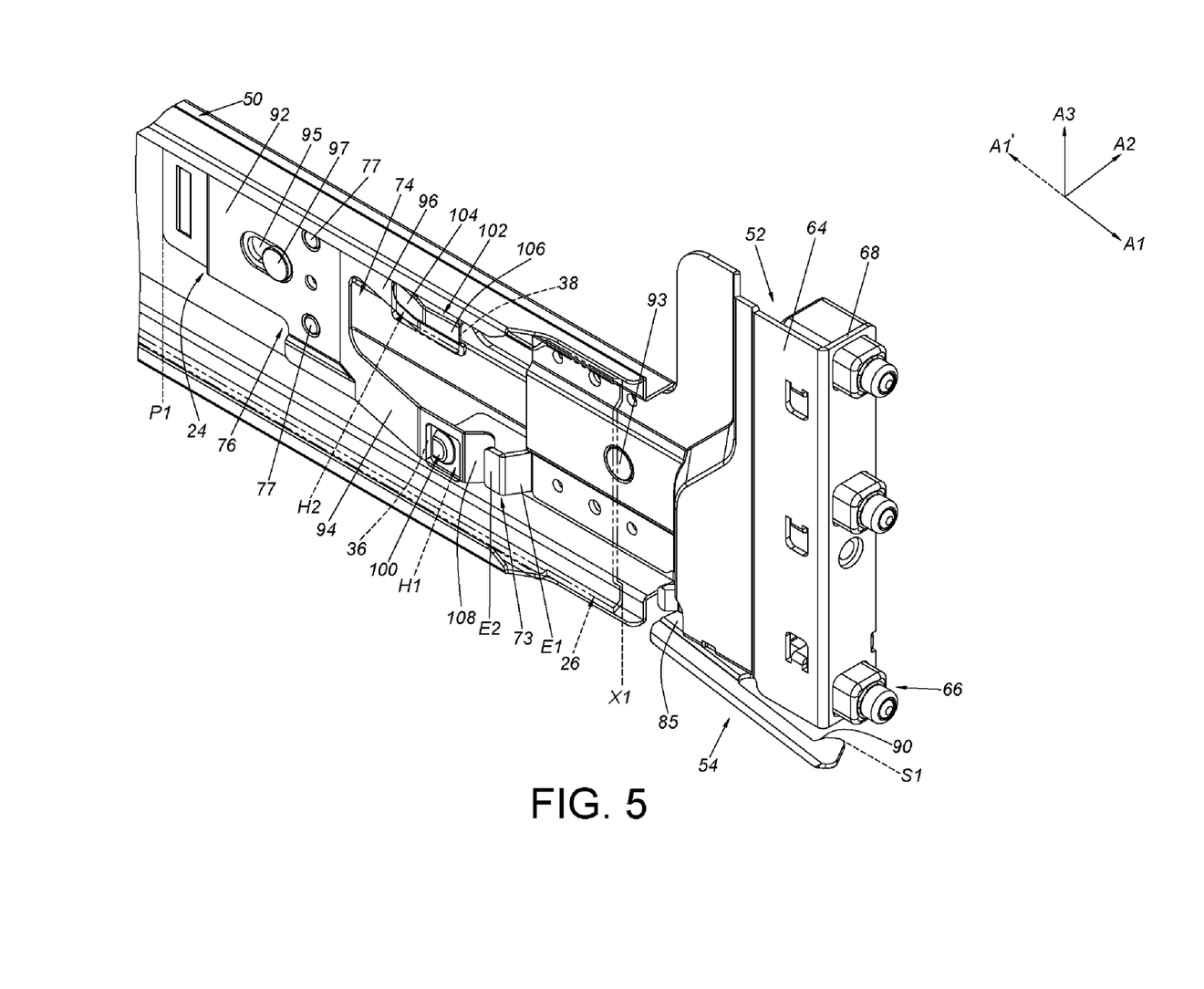
FIG. 5 is a diagram illustrating a rail member of the slide rail assembly located at a first predetermined position relative to a first bracket device of the bracket driving mechanism in first viewing angle according to the embodiment of the present invention.

Preferably, the driving device 24 includes an extension member 74 and an elastic member 76. The extension member 74 is connected to the elastic member 76. In the present embodiment, the extension member 74 is fixedly connected to the elastic member 76 through at least one connecting section 77, but the present invention is not limited specifically. For example, the at least one connecting section 77 can be a protruding post fixedly fastened to a hole of the elastic member 76 (as shown in FIG. 5), or the at least one connecting section 77 can be fixedly connected to the elastic member 76 by riveting. The extension member 74 has a longitudinal length.

Preferably, the driving device 24 further includes a first driving portion 78 and a second driving portion 80 arranged on the extension member 74. The first driving portion 78 and the second driving portion 80 respectively include an inclined surface or an arc surface. In the present embodiment, the first driving portion 78 and the second driving portion 80 are arranged on a component 82, and the component 82 is fixedly connected to the extension member 74 through at least one connecting feature 84, but the present invention is not limited specifically.

Preferably, the component 82 is located adjacent to an end portion of the extension member 74, and the elastic member 76 is located adjacent to another end portion of the extension member 74. The end portion and the other end portion of the extension member 74 are opposite to each other.

Figure 4A:
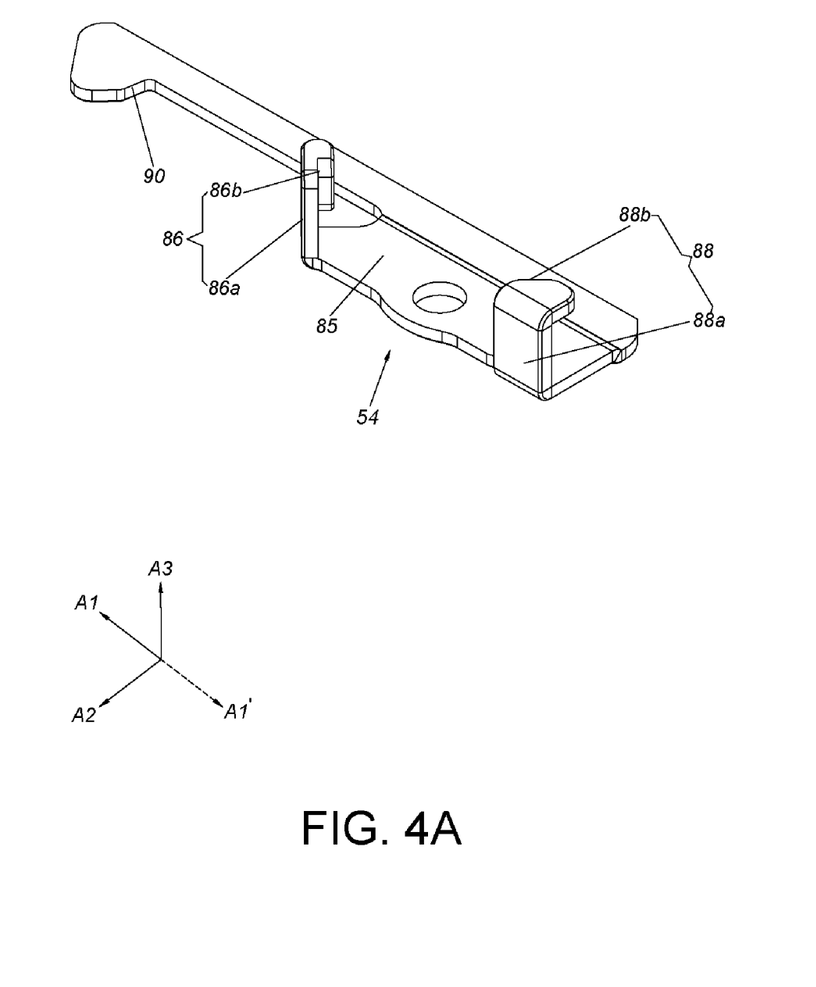
FIG. 4a is a diagram illustrating a fastening member according to the embodiment of the present invention.

Preferably, the fastening member 54 includes a main body portion 85, a first extension section 86 and a second extension section 88. The first extension section 86 and the second extension section 88 are arranged on the main body portion 85. The shaft member 70 penetrates the main body portion 85. The shaft member 70 is substantially located between the first extension section 86 and the second extension section 88. As shown in FIG. 4a, the first extension section 86 includes a connecting section 86a and a guiding section 86b. The connecting section 86a extends from the main body portion 85 along a height direction A3, and the guiding section 86b is bent from and overlapped on the connecting section 86a. The second extension section 88 includes a connecting section 88a and a guiding section 88b. The connecting section 88a extends from the main body portion 85 along the height direction A3. The guiding section 88b is bent transversely from the connecting section 88a. The height direction A3 is perpendicular to the longitudinal direction A1 and the transverse direction A2. Preferably, the guiding section 86b of the first extension section 86 is an inclined surface or an arc surface, and the guiding section 88b of the second extension section 88 is an inclined surface or an arc surface. The fastening member 54 has a fastening portion 90 extended longitudinally from the main body portion 85.

Preferably, the first driving portion 78 of the driving device 24 and the second driving portion 80 respectively correspond to the first extension section 86 of the fastening member 54 and the second extension section 88.

Preferably, the elastic member 76 includes a fixed portion 92, a first elastic arm 94 and a second elastic arm 96. The fixed portion 92 is fixedly connected to the extension member 74. The first elastic arm 94 and the second elastic arm 96 are respectively connected to the fixed portion 92 and are deflected by a predetermined angle relative to the fixed portion 92. The first elastic arm 94 and the second elastic arm 96 are respectively located adjacent to a first side portion 98a and a second side portion 98b of the extension member 74.

Preferably, a first longitudinal feature 91 (e.g. a long hole) is arranged on one of the driving device 24 and the first bracket device 22 (such as the supporting frame 50 or the bracket 52 of the first bracket device 22), and a first connecting member 93 is arranged on another one of the driving device 24 and the first bracket device 22 (such as the supporting frame 50 or the bracket 52 of the first bracket device 22). Through the first connecting member 93 penetrating a part of the first longitudinal feature 91, the driving device 24 and the first bracket device 22 are able to be moved longitudinally in a limited range.

Preferably, two second longitudinal features 95 (e.g. two long holes) are arranged on one of the driving device 24 (such as the elastic member 76 or the extension member 74 of the driving device 24) and the first bracket device 22 (such as the supporting frame 50 of the first bracket device 22), and a second connecting member 97 is arranged on another one of the driving device 24 (such as the elastic member 76 or the extension member 74 of the driving device 24) and the first bracket device 22 (such as the supporting frame 50 of the first bracket device 22). The second connecting member 97 penetrates the two second longitudinal features 95.

As shown in FIG. 5, the rail member 26 is located at a first predetermined position X1 relative to the supporting frame 50 (or the bracket 52) of the first bracket device 22.

Preferably, the driving device 24 includes a first driving feature 100 and a second driving feature 102. In the present embodiment, the first driving feature 100 and the second driving feature 102 are respectively arranged on the first elastic arm 94 of the elastic member 76 and the second elastic arm 96, but the present invention is not limited specifically.

Preferably, the first driving feature 100 and the second driving feature 102 are two protrusions. Wherein, the second driving feature 102 has a guiding section 104 and a supporting section 106 adjacent to the guiding section 104. The guiding section 104 includes an inclined surface or an arc surface.

Preferably, the first elastic arm 94 of the elastic member 76 includes a guiding portion 108 adjacent to the first driving feature 100. The guiding portion 108 includes an inclined surface or an arc surface.

Furthermore, when the rail member 26 is located at the first predetermined position X1 relative to the supporting frame 50 (or the bracket 52) of the first bracket device 22, the first driving feature 100 of the first elastic arm 94 of the elastic member 76 is located in the first space H1 of the rail member 26, and the first driving feature 100 corresponds to the first structure 36. On the other hand, the second driving feature 102 of the second elastic arm 96 of the elastic member 76 is located in the second space H2 of the rail member 26, and the second driving feature 102 corresponds to the second structure 38. In addition, the fastening member 54 is in a first state S1 (such as an unlock state, but the present invention is not limited), and when the fastening member 54 is in the first state S1, the fastening portion 90 of the fastening member 54 is far from the at least one mounting member 66.

Figure 6:
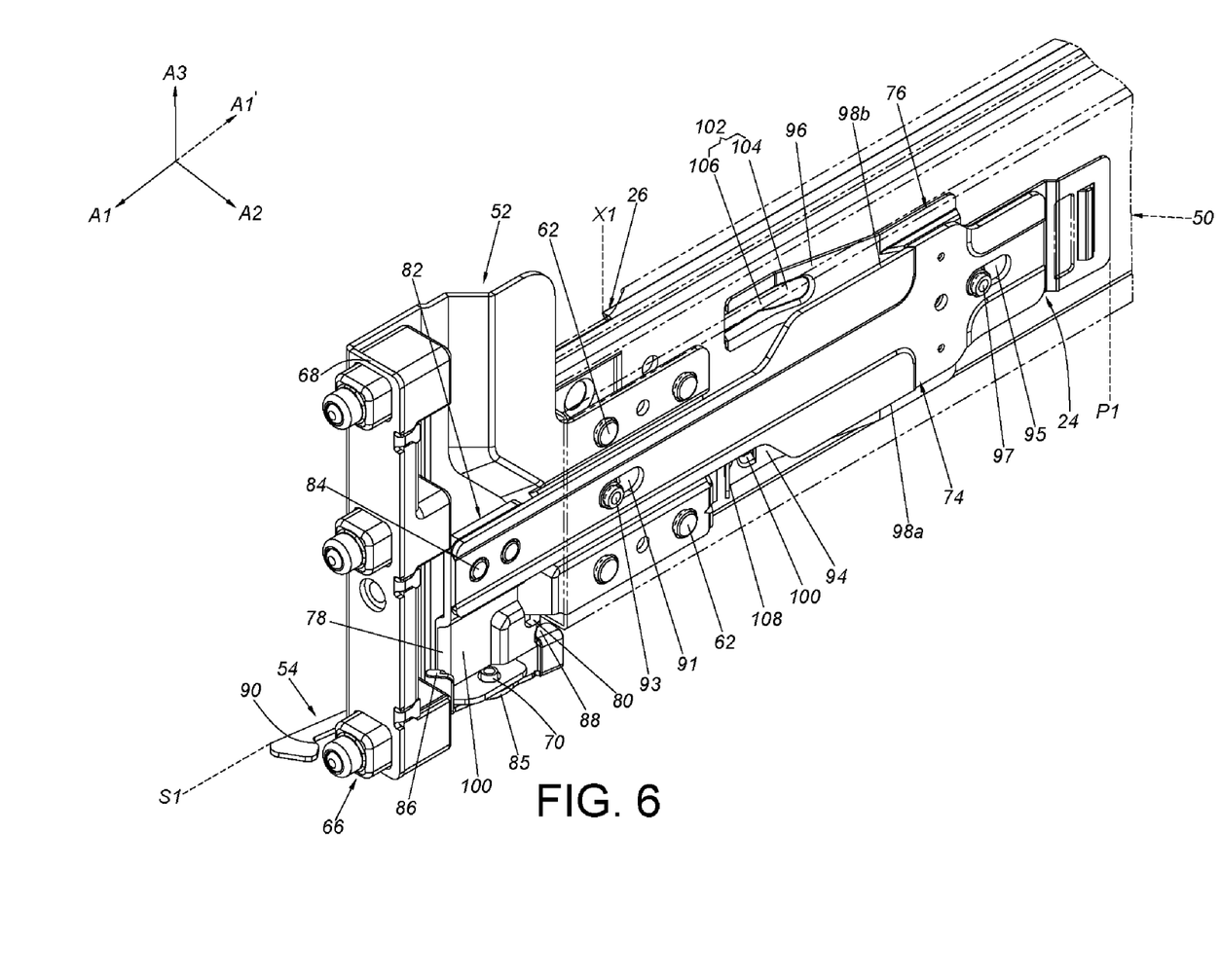
FIG. 6 is a diagram illustrating the rail member of the slide rail assembly located at the first predetermined position relative to the first bracket device in second viewing angle according to the embodiment of the present invention.

As shown in FIG. 6, when the rail member 26 is located at the first predetermined position X1 relative to the supporting frame 50 (or the bracket 52) of the first bracket device 22, the fastening member 54 is in the first state S1. Wherein, the position of the first driving portion 78 of the driving device 24 corresponds to the first extension section 86 of the fastening member 54.

Figure 7:
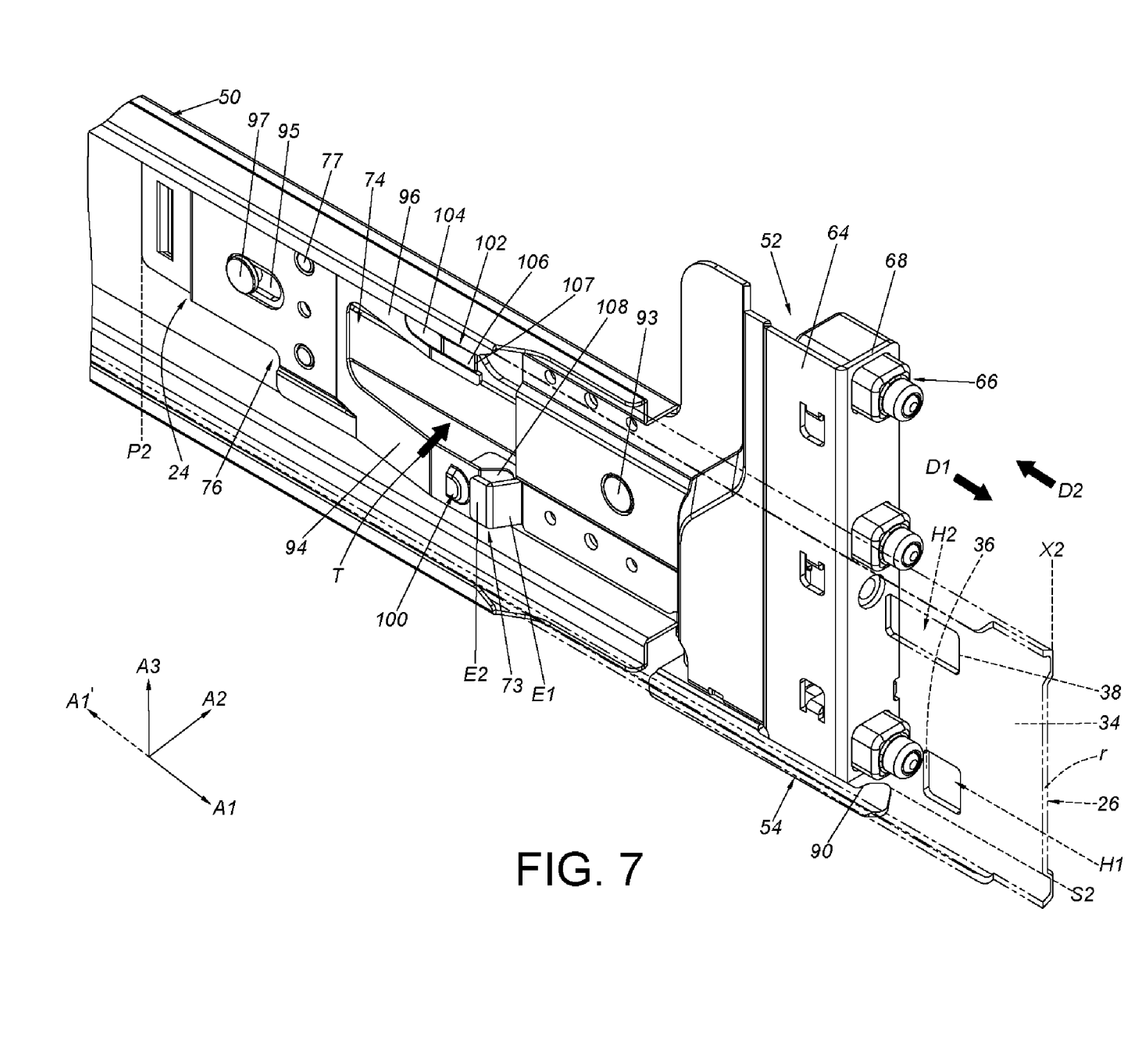
FIG. 7 is a diagram illustrating the rail member of the slide rail assembly located at a second predetermined position relative to the first bracket device in first viewing angle according to the embodiment of the present invention.

As shown in FIG. 5 and FIG. 7, the rail member 26 and the first bracket device 22 are longitudinally movable relative to each other. Hereinafter, it is illustrative of an example that the rail member 26 is movable along a first direction D1 relative to the first bracket device 22. For example, when the rail member 26 is moved relative to the supporting frame 50 (or the bracket 52) of the first bracket device 22 from the first predetermined position X1 along the first direction D1 by a predetermined traveling distance to a second predetermined position X2, the first structure 36 of the rail member 26 drives the first driving feature 100 to move, such that the extension member 74 and the elastic member 76 are moved, and the second auxiliary section E2 drive the guiding portion 108 to move, such that the rail member 26 is able to be further moved relative to the bracket 52 along the first direction D1. Wherein, the first direction D1 is the extension direction of the slide rail assembly 20, and is parallel with the longitudinal direction A1. In other words, the driving device 24 is drove to move from a first position P1 (as shown in FIG. 5) to a second position P2 (as shown in FIG. 7), such that the driving device 24 is configured to drive the fastening member 54 of the first bracket device 22 to switch from the first state S1 to a second state S2 (such as a lock state, but the present invention is not limited) (as shown in FIG. 7). Wherein, when the fastening member 54 is in the second state S2, the fastening portion 90 of the fastening member 54 is located adjacent to the at least one mounting member 66.

Figure 8:
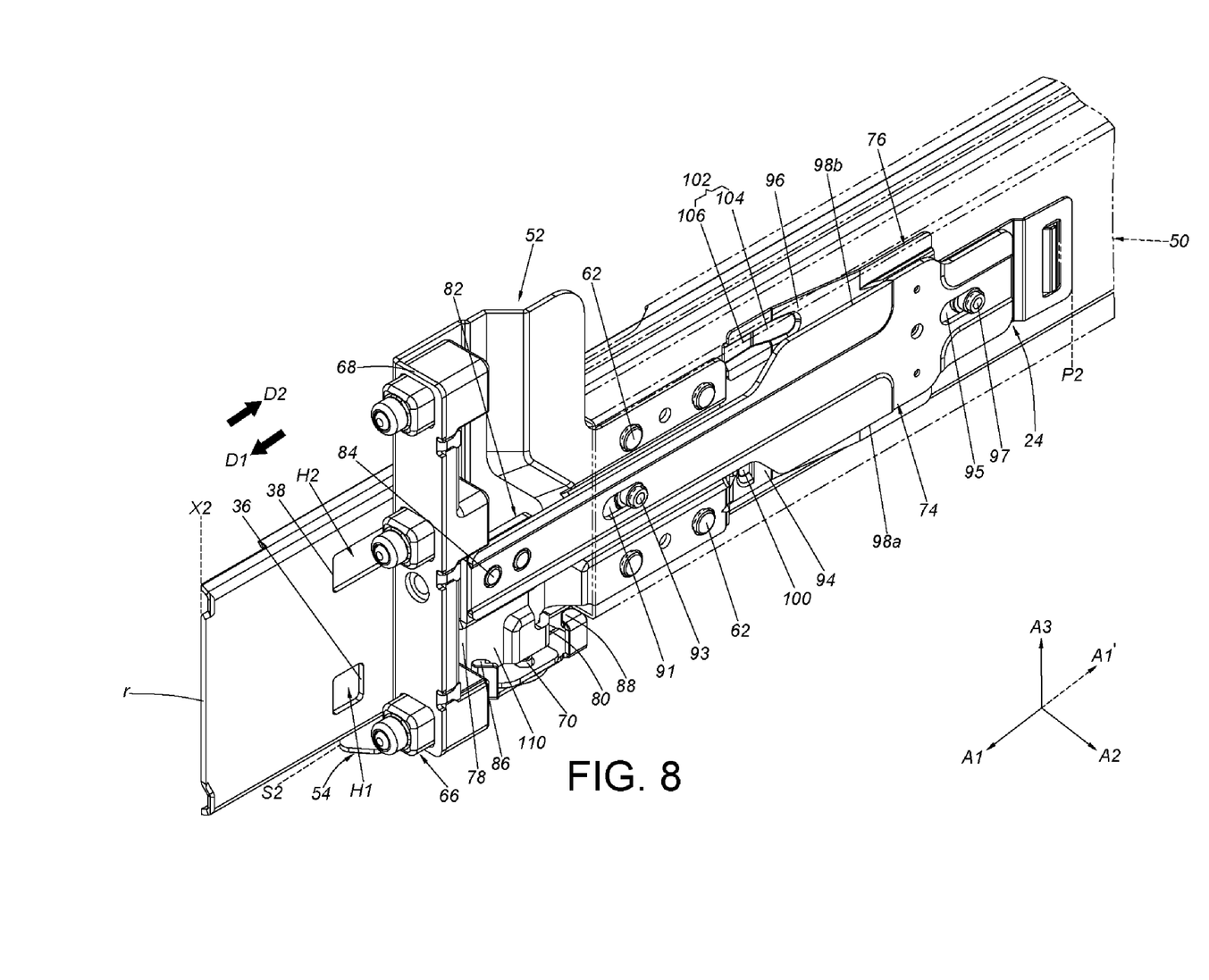
FIG. 8 is a diagram illustrating the rail member of the slide rail assembly located at second predetermined position relative to the first bracket device in second viewing angle according to the embodiment of the present invention.

As shown in FIG. 8, when the rail member 26 is moved relative to the supporting frame 50 (or the bracket 52) of the first bracket device 22 from the first predetermined position X1 along the first direction D1 to the second predetermined position X2, the fastening member 54 is drove to switch from the first state S1 to the second state S2 through the first driving portion 78 of the driving device 24 abutting the first extension section 86 of the fastening member 54. Preferably, the component 82 further includes an intermediate section 110 arranged between the first driving portion 78 and the second driving portion 80. When the fastening member 54 is in the second state S2, the fastening member 54 is able to be supported by the intermediate section 110 through the first extension section 86 to keep the fastening member 54 in the second state S2. In addition, when the fastening member 54 is in the second state S2, the position of the second extension section 88 of the fastening member 54 corresponds to the second driving portion 80 of the driving device 24.

As shown in FIG. 5 and FIG. 7, when the rail member 26 is moved relative to the supporting frame 50 (or the bracket 52) of the first bracket device 22 from the first predetermined position X1 along the first direction D1 to the second predetermined position X2, the rail member 26 is able to abut the first driving feature 100 (as shown in FIG. 5) through the first structure 36 to drive the driving device 24 to move from the first position P1 (as shown in FIG. 5) to the second position P2 (as shown in FIG. 7) along the first direction D1.

Preferably, when the driving device 24 is drove by the rail member 26 to move along the first direction D1 to the second position P2, the guiding portion 108 of the first elastic arm 94 of the elastic member 76 abuts the second auxiliary section E2 of the auxiliary structure 73 of the bracket 52, such that the first elastic arm 94 is able to be guided and be pressed by the second auxiliary section E2 of the auxiliary structure 73. In the meantime, the first elastic arm 94 is deflected along the lateral direction T to accumulate a first elastic force (as shown in FIG. 7). Wherein, the lateral direction T is parallel with the transverse direction A2. On the other hand, the second elastic arm 96 is able to be pressed by wall surface of the longitudinal body 34 of the rail member 26 to be deflected along the lateral direction T to accumulated a second elastic force (as shown in FIG. 7) through the supporting section 106 of the second driving feature 102. Wherein, when the first elastic arm 94 is pressed by the second auxiliary section E2 of the auxiliary structure 73, the position of the first driving feature 100 of the first elastic arm 94 of the elastic member 76 does not correspond to the first structure 36 of the rail member 26. When the second elastic arm 96 is pressed by wall surface of the longitudinal body 34 of the rail member 26, the position of the second driving feature 102 of the second elastic arm 96 of the elastic member 76 does not correspond to the second structure 38 of the rail member 26.

As shown in FIG. 7, when the rail member 26 is moved relative to the supporting frame 50 (or the bracket 52) of the first bracket device 22 from the second predetermined position X2 along a second direction D2 opposite to the first direction D1 (and the longitudinal direction A1) to the first predetermined position X1, as long as the position of the second driving feature 102 of the second elastic arm 96 of the elastic member 76 is located at the second space H2 of the rail member 26 again, the second elastic arm 96 is able to release the second elastic force, such that the second driving feature 102 corresponds to the second structure 38, and the rail member 26 is able to abut a part 107 of the supporting section 106 of the second driving feature 102 through the second structure 38 to drive the driving device 24 to move from the second position P2 to the first position P1 along the second direction D2, in order to further drive the fastening member 54 of the first bracket device 22 to switch from the second state S2 into the first state S1. As shown in FIG. 8, when the driving device 24 is moved from the second position P2 along the second direction D2 to the first position P1, the driving device 24 is able to abut the second extension section 88 of the fastening member 54 through the second driving portion 80, such that the fastening member 54 is switched from the second state S2 into the first state S1.

Figure 9:
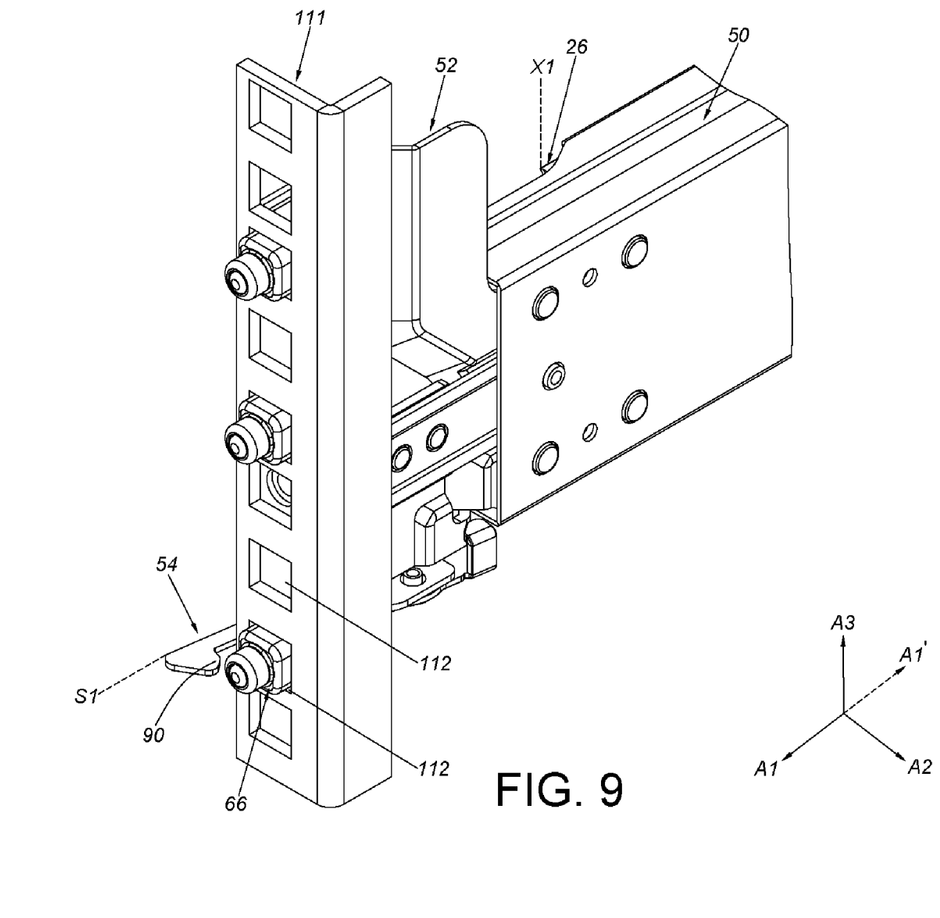
FIG. 9 is a diagram illustrating the first bracket device of the slide rail assembly being mounted on a first post of a rack, and the rail member located at the first predetermined position relative to the first bracket device in second viewing angle according to the embodiment of the present invention.
Figure 10:
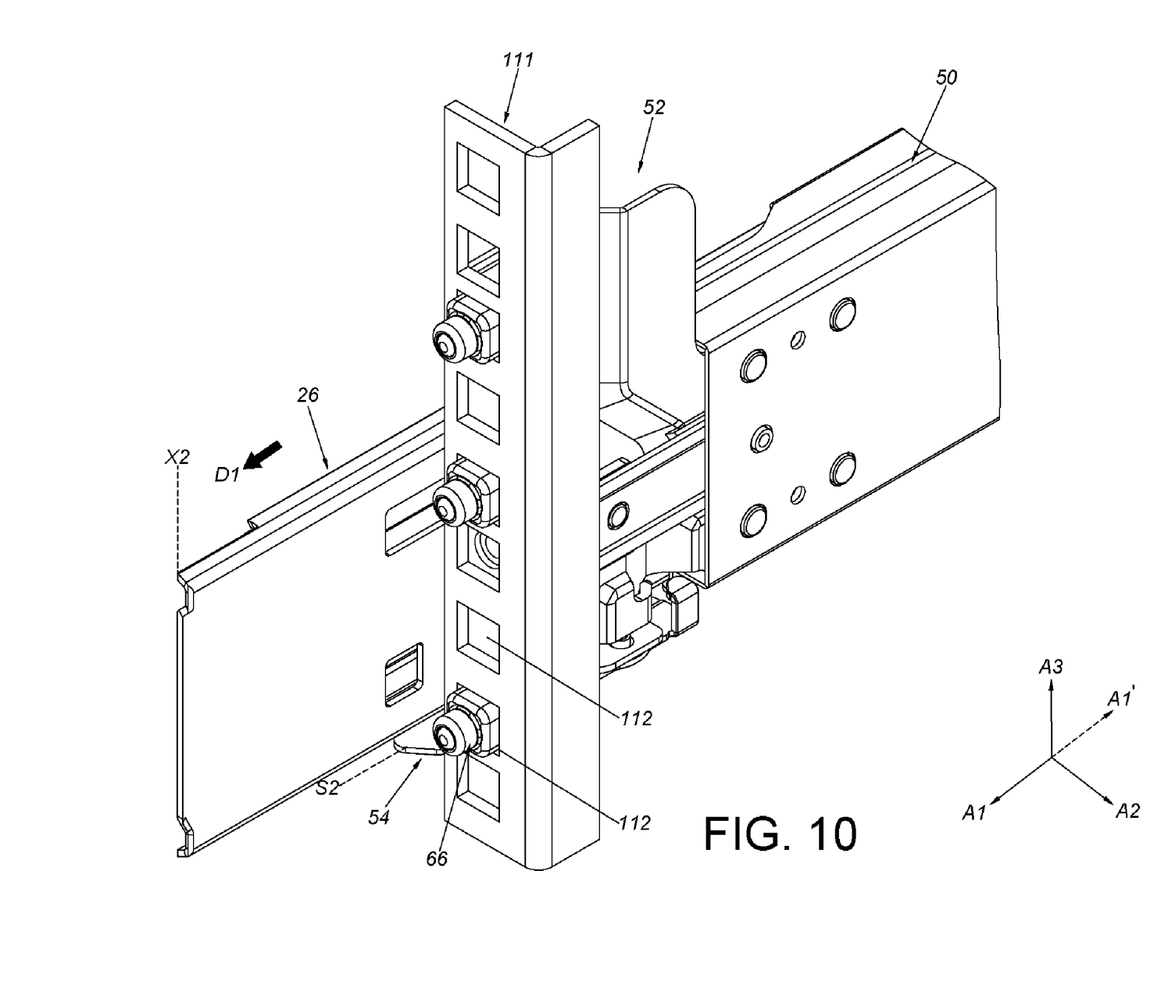
FIG. 10 is a diagram illustrating the first bracket device of the slide rail assembly being mounted on the first post of the rack, and the rail member located at the second predetermined position relative to the first bracket device in second viewing angle according to the embodiment of the present invention.

As shown in FIG. 9 and FIG. 10, the slide rail assembly 20 can be applied to a rack. The rack has a first post 111. The first post 111 has a plurality of mounting holes 112. Specifically, the slide rail assembly 20 is able to be mounted in one of the plurality of mounting holes 112 of the first post 111 through the at least one mounting member 66 of the bracket 52 of the first bracket device 22. In addition, when the rail member 26 is moved relative to the supporting frame 50 of the first bracket device 22 from the first predetermined position X1 (as shown in FIG. 9) along the first direction D1 to the second predetermined position X2 (as shown in FIG. 10), the rail member 26 is able to drive the driving device 24 to move from the first position P1 (please refer to FIG. 6) to the second position P2 (please refer to FIG. 8), such that the driving device 24 is configured to drive the fastening member 54 of the first bracket device 22 to switch from the first state S1 (as shown in FIG. 9) into the second state S2 (as shown in FIG. 10). Wherein, when the fastening member 54 is in the second state S2, the fastening portion 90 of the fastening member 54 is located adjacent to the at least one mounting member 66, and the fastening portion 90 of the fastening member 54 is able to fasten the first post 111, such that the mounting procedure of the first bracket device 22 being mounted on the first post 111 is complete.

Figure 11:
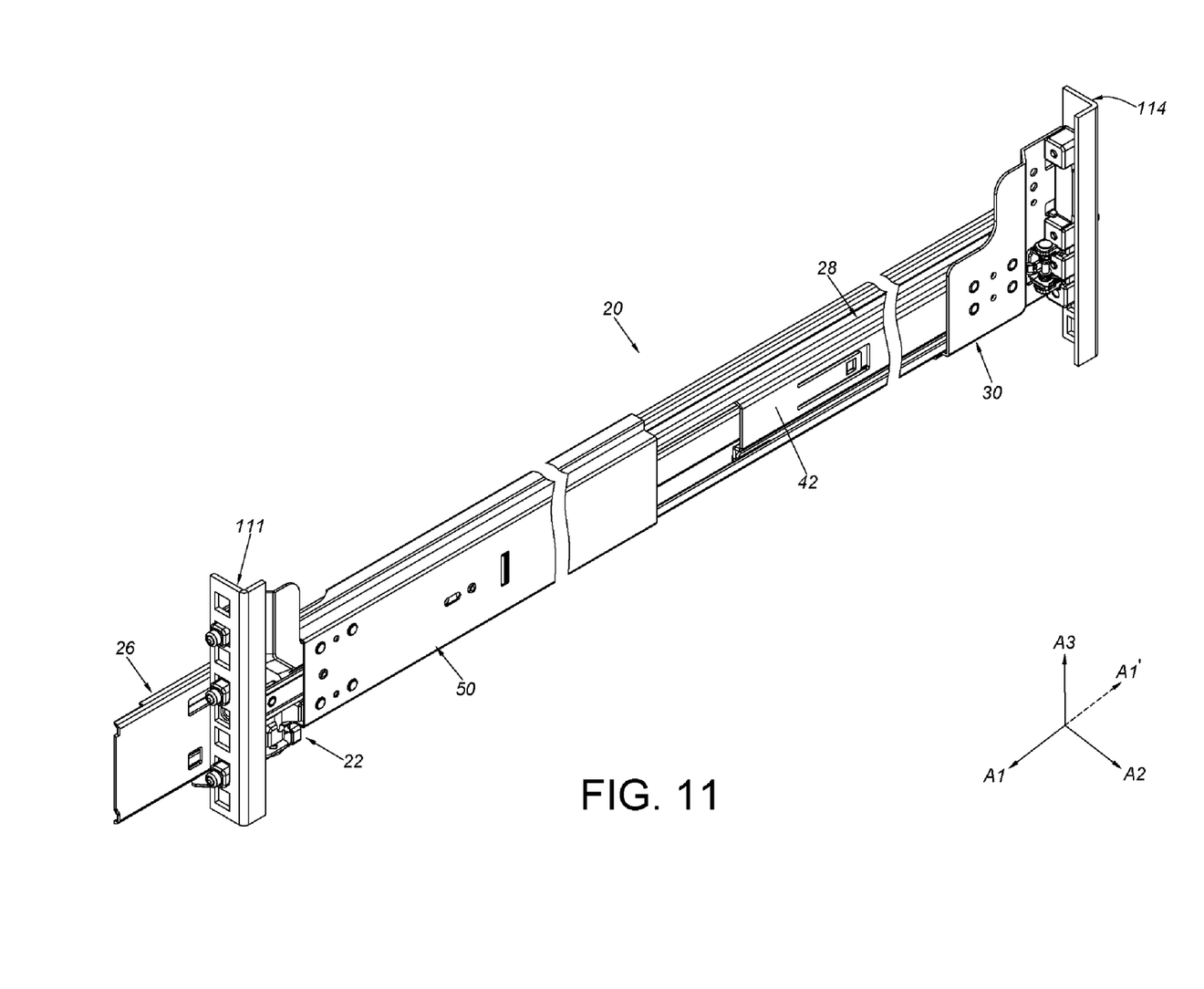
FIG. 11 is a diagram illustrating the first bracket device of the slide rail assembly being mounted on the first post of the rack, and a second bracket device of the slide rail assembly being mounted on a second post of the rack according to the embodiment of the present invention.

As shown in FIG. 11, when the slide rail assembly 20 is mounted on the first post 111 through the first bracket device 22, the second bracket device 30 is able to be movably adjusted and be mounted on a second post 114 of the rack.

Compared to the prior art, the slide rail assembly 20 of the present embodiment has advantages over the prior art by the following perspectives:

1. The bracket 52 of the first bracket device 22 is arranged on (such as fixedly connected) to the supporting frame 50, and the driving device 24 is able to be drove to move from the first position P1 to the second position P2, to further drive the fastening member 54 to switch from the first state S1 into the second state S2. The above arrangement is different from the prior art.

2. The upper supporting wall 56a of the supporting frame 50 and the lower supporting wall 56b are configured to respectively clad a portion of the upper side wall 32a of the rail member 26 and a portion of the lower side wall 32b. According to the above arrangement, the structure strength of the rail member 26 can be improved through the supporting frame 50 of first bracket device 22. The longitudinally traveling distance of the first bracket device 22 along the rail member 26 is also improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first bracket device comprising a supporting frame, a bracket and a fastening member, the supporting frame being connected to the bracket, and the fastening member being pivoted to the bracket by a shaft member;
a driving device, wherein the driving device and the first bracket device are longitudinally movable relative to each other; and
a rail member, wherein the rail member and the first bracket device are longitudinally movable relative to each other;
wherein when the rail member is moved relative to the first bracket device from a first predetermined position along a first direction by a predetermined traveling distance, the rail member is able to drive the driving device to move from a first position to a second position, in order to drive the fastening member of the first bracket device to switch from a first state into a second state.

2. The slide rail assembly of claim 1, wherein the bracket comprises a longitudinal portion and at least one mounting member arranged adjacent to the longitudinal portion.

3. The slide rail assembly of claim 2, wherein the bracket further comprises an end portion substantially perpendicularly connected to the longitudinal portion, the at least one mounting member is arranged on the end portion.

4. The slide rail assembly of claim 2, wherein when the fastening member of the first bracket device is in the first state, a fastening portion of the fastening member is far from the at least one mounting member, when the fastening member of the first bracket device is in the second state, the fastening portion of the fastening member is adjacent to the at least one mounting member.

5. The slide rail assembly of claim 2, wherein the driving device comprises a first driving feature, the rail member comprises a first structure, the rail member is able to abut the first driving feature through the first structure to drive the driving device move along the first direction from the first position to the second position.

6. The slide rail assembly of claim 5, wherein the driving device further comprises a second driving feature, the rail member further comprises a second structure, the rail member is able to abut the second driving feature through the second structure to drive the driving device move along a second direction opposite to the first direction from the second position to the first position, in order to drive the fastening member of the first bracket device to switch from the second state into the first state.

7. The slide rail assembly of claim 6, wherein the driving device further comprises an extension member and an elastic member, the extension member is connected to the elastic member, the elastic member comprises a first elastic arm, and the first driving feature is arranged on the first elastic arm.

8. The slide rail assembly of claim 7, wherein the elastic member further comprises a second elastic arm and the second driving feature is arranged on the second elastic arm.

9. The slide rail assembly of claim 7, wherein a longitudinal feature is arranged on one of the driving device and the first bracket device, and a connecting member is arranged on the other one of the driving device and the first bracket device, the connecting member is able to penetrate through a part of the longitudinal feature, such that the driving device and the first bracket device are longitudinally movable relative to each other in a range.

10. The slide rail assembly of claim 6, wherein the fastening member comprises a first extension section and a second extension section, the driving device further comprises a first driving portion and a second driving portion both arranged on the extension member, and the first driving portion and the second driving portion are respectively corresponding to the first extension section and the second extension section.

11. The slide rail assembly of claim 10, wherein the supporting frame comprises an upper supporting wall, a lower supporting wall and a longitudinal wall connected between the upper supporting wall, and the lower supporting wall, a supporting passage is defined by the upper supporting wall, a lower supporting wall and the longitudinal wall and configured to accommodate the rail member, the upper supporting wall and the lower supporting wall of the supporting frame is respectively configured to clad a portion of an upper side wall and a portion of a lower side wall of the rail member.

12. The slide rail assembly of claim 1, further comprising a reinforcing member and a second bracket device, wherein the reinforcing member is arranged on the rail member, the reinforcing member comprises a reinforcing passage, and the second bracket device is movably mounted in the reinforcing passage through a longitudinal section.

13. A bracket driving mechanism, comprising:
a bracket device comprising a supporting frame, a bracket and a fastening member, the supporting frame being connected to the bracket, and the fastening member being pivoted to the bracket by a shaft member; and
a driving device, wherein the driving device and the bracket device are movable relative to each other;
wherein when one of the driving device and the bracket device is moved from a first position to a second position relative to the other one of the driving device and the bracket device, the driving device is able to drive the fastening member of the bracket device to switch from a first state into a second state.

14. The bracket driving mechanism of claim 13, wherein the bracket comprises a longitudinal portion and at least one mounting member adjacent to the longitudinal portion.

15. The bracket driving mechanism of claim 14, wherein when the fastening member of the bracket device is in the first state, a fastening portion of the fastening member is far from the at least one mounting member, when the fastening member of the bracket device is in the second state, the fastening portion of the fastening member is adjacent to the at least one mounting member.

16. The bracket driving mechanism of claim 13, wherein the fastening member comprises a first extension section and a second extension section, the driving device comprises a first driving portion and a second driving portion, and the first driving portion and the second driving portion are respectively corresponding to the first extension section and the second extension section.

17. The bracket driving mechanism of claim 13, wherein a longitudinal feature is arranged on one of the driving device and the bracket device, and a connecting member is arranged on the other one of the driving device and the bracket device, the connecting member is able to penetrate through a part of the longitudinal feature, such that the driving device and the bracket device are longitudinally movable relative to each other.

* * * * *